(12) United States Patent  
Schaefer et al.

(10) Patent No.: US 7,709,744 B2
(45) Date of Patent: May 4, 2010

(54) GAS VENTING COMPONENT MOUNTING PAD

(75) Inventors: Richard C. Schaefer, Hillsboro, OR (US); Steven Pollock, Hillsboro, OR (US); Charles M. Bailley, Beaverton, OR (US); Mike Lowe, Aloha, OR (US); Andrew J. Balk, Beaverton, OR (US); John G. Oldendorf, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 404 days.

(21) Appl. No.: 11/694,188

(22) Filed: Mar. 30, 2007

(65) Prior Publication Data

US 2008/0236871 A1   Oct. 2, 2008

(51) Int. Cl.
*H05K 1/00* (2006.01)
(52) U.S. Cl. .................................. 174/250; 361/768
(58) Field of Classification Search ................ 174/250, 174/261, 260; 361/768; 257/737, 775
See application file for complete search history.

(56) References Cited

U.S. PATENT DOCUMENTS

| 5,842,275 | A  | * | 12/1998 | McMillan et al. | .............. 29/840 |
| 6,181,551 | B1 | * | 1/2001  | Herman et al.   | ........... 361/679.6 |
| 6,362,435 | B1 | * | 3/2002  | Downey et al.   | .............. 174/260 |
| 6,362,436 | B1 | * | 3/2002  | Kimbara et al.  | .............. 174/260 |
| 7,365,274 | B2 | * | 4/2008  | Miya et al.     | .................. 174/260 |

* cited by examiner

*Primary Examiner*—Jinhee J Lee
*Assistant Examiner*—Yuriy Semenenko
(74) *Attorney, Agent, or Firm*—Grossman, Tucker, Perreault & Pfleger, PLLC

(57) ABSTRACT

Venting for component mounting pads of surface mount circuit boards allows the escape of gases from the junction between an electrical component and its associated mounting pad during soldering and facilitates a more complete and effective solder joint between the component base and pad. The venting may be accomplished by either one or more through holes in the board through the pads to allow undesirable gases to escape to the underside of the board, or by one or more solder free channels formed in the pad to allow the gases to escape through the periphery of the pad.

13 Claims, 1 Drawing Sheet

GAS VENTING COMPONENT MOUNTING PAD

FIELD

The present disclosure is related to Surface Mounting Technology (SMT) for electronic printed circuit boards and more specifically to the soldering of SMT electronic components to mounting pads formed on the boards and to venting for the escape of created or otherwise trapped gas during soldering.

BACKGROUND

One common type of electronic circuit board is Surface Mounting Technology (SMT). As opposed to the most basic form of traditional through board mounting, in which electronic components such as IC's, transistors, and resistors are positioned on the top surface of a circuit board with their connection leads passed through holes in the board and soldered to conducting pathways on the bottom surface of the board, in the most basic form of SMT, conducting pathways run on the top surface of the circuit board to interconnect the electronic components, which are positioned on the top surface of the board with their connection leads soldered to the pathways on the top surface. SMT circuit boards are not limited to having all of their conductive pathways on the top surface of the board however. Two sided boards having pathways on the top and bottom surfaces and multi layered boards having pathways laminated within the board are also common forms of SMT. The pathways in differing layers may be electrically connected by conductive via's, which are most basically described as electrical connections that pass through holes drilled through the board from one pathway to another.

For certain components, the soldering of the leads to the lead pads on the pathways provides both the electrical and mechanical fastening of the component to the board. For other components, such as those with more significant mass or height, or those which generate heat during use, like IC's and high power transistors, Surface Mounting Pads (SMT pads) are formed on the top surface of the board, to which the component's base may be affixed. SMT Pads are planar solder coated or solder ready surfaces formed, usually by reverse etching, on and integral with the top surface of the board just under the intended location of the component's body.

SMT pads provide a structural foundation for securely soldering the component to the board to avoid reliance for mechanical affixation solely on the soldering of the leads. This reduces stress on the lead connections and improves connection reliability, particularly for components of more significant mass or higher profile which are more susceptible to lead connection stress. Additionally, SMT pads may be thermal sinks which conduct damaging heat from energy consuming and heat generating components such as IC's, thereby facilitating faster operating speeds and higher power consumption.

SMT pads may further provide an electrical connection, most often a grounding, of the component base to the circuit. Surface mounting electrical components intended for affixation to SMT Pads generally have a metallic base or base plating which may be physically integrated with the component body and which may be thermally connected to the heat generating elements of the component. This metallic base may have a flat bottom surface. The metallic base may be made of or plated with a solder compatible material, such as copper or tin.

SMT pads are generally sized and shaped according to standardized footprints that match the base surface size and shape of the components that will be mounted on the pad. This provides the most effective mechanical affixation, and the most efficient thermal and electrical communication. A coating of flux may be layered between the SMT Pad and the component base prior to positioning the component on the board, with the goal of facilitating a complete and void free solder bond between the SMT Pad and base during soldering. When the component is properly positioned on the top surface of the board, each lead is positioned atop its related lead connection pad on the board, and the metallic base is positioned atop and aligned with the SMT Pad. The flat bottom surface of the base preferably lies directly on and against the flat surface of the SMT pad. A common technique for soldering the components to the board is to pass the board, with all components in place, through an oven to melt the solder. This preferably results not only in the electrical solder connection of the leads to the pathways, but also in the molten solder completely filling the space between the component bases and their associated SMT Pads, hopefully expelling any gas there from.

Due to the plane to plane relationship between the component base and SMT Pad, a common manufacturing problem during soldering is the creation or entrapment of gases within the thin space between the components and pads. Air existing in these junctions prior to soldering due to any non-planarity of either surface may become entrapped, say for instance when the perimeter of the base is soldered before soldering is complete. Off-gases from the soldering process or from oxidation of impurities in the solder may also develop in the junction.

Reduction of mechanical strength of the base to SMT Pad solder joint is one problem resulting from such gas voids. Additionally, the reduction in thermal and electrical conductivity between the base and the SMT pad can create significant performance and reliability problems for the associated component and the entire circuit, which is difficult to initially detect by any known inspection technique. Also, entrapped gases may expand as the component heats up during use, thereby causing pressure between the component and circuit board which may lead to numerous other types of component and circuit failures which are difficult to detect during initial testing. And entrapped gases may cause catastrophic failures in circuit boards used in high or low pressure environments, such as underwater or in deep space.

BRIEF DESCRIPTION OF THE DRAWINGS

Features and advantages of the claimed subject matter will be apparent from the following detailed description of embodiments consistent therewith, which description should be considered with reference to the accompanying drawings, wherein:

DETAILED DESCRIPTION

Figure 2:
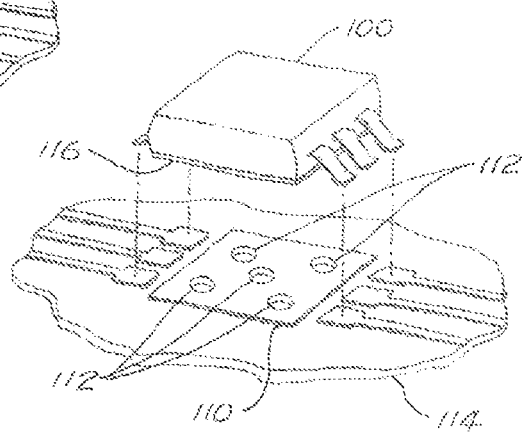
FIG. 2 is an exploded view of an electronic component and a vented SMT Pad.
Figure 3:
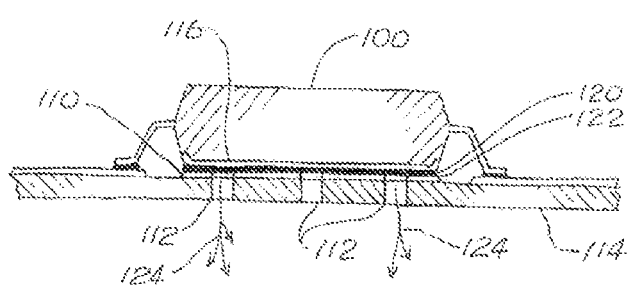
FIG. 3 is a cross-sectional view through the component and the vented SMT Pad of FIG. 2 during soldering.
Figure 4:
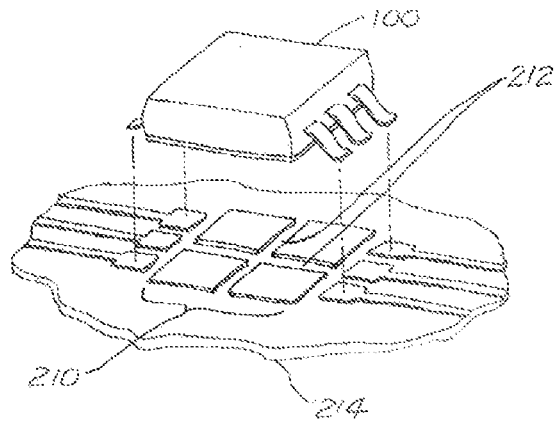
FIG. 4 is an exploded view of an electronic component and a second vented SMT Pad.

Two embodiments of a surface mounting "SMT" pads having venting for the escape of gas during soldering are shown in FIGS. 2 through 4. A first embodiment having vents in the form of holes through a pad and circuit board is shown in FIGS. 2 and 3. A second embodiment having vents in the form of channels in a pad is shown in FIG. 4.

Figure 1:
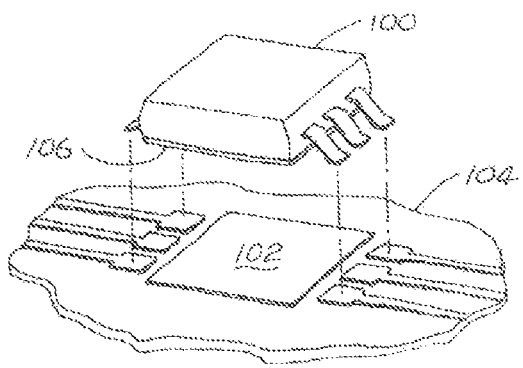
FIG. 1 is an exploded view of an electronic component and an unvented SMT Pad according to the prior art.

Referring first to a conventional mounting arrangement, FIG. 1 depicts a typical component 100 and mounting pad 102. Pad 102 is a flat layer of solder ready or solder plated metal formed by mask reverse etching on the upper surface of a circuit board 104. Typically, a board for the manufacture of such a circuit board initially is made of a nonconductive base layer, such as a sheet of fiberglass, having a thin layer of copper plated entirely over its top surface. Mask reverse etching removes all of the copper plating except those desired features such as conductive pathways, grounding planes, and mounting pads. Via holes may be drilled through the board and portions of these features may then be fluxed or solder plated to enable the soldering thereto of such things as electronic components. SMT pads are generally among those features that are solder plated or made solder ready.

The base surface 106 of component 100 may also be a flat solder ready or solder plated metallic layer. A solder facilitating flux may be applied to one of or both base surface 106 and mounting pad 102 prior to positioning the component atop and in alignment with the pad, which generally has a shape and size comparable to the shape and size of base surface 106. Heat and solder may next be applied to the junction of base surface 106 and pad 102, causing solder to migrate into the junction and affix component 100 to pad 102, and thereby to circuit board 104.

It may be appreciated that any irregularities in the planarity of base surface 106 and pad 102 may result in a gap, and therefore a void or an air pocket, in the junction or interface there between. In cases where the periphery of the component base 106 and pad 102 are joined around such air pockets, these air pockets may become permanently entrapped under component 100 when the component is soldered to the pad. Alternatively, impurities in the flux or solder and off-gases created by the soldering process may cause gas bubbles to form in the junction during soldering and to become permanently entrapped as voids in the junction as the solder hardens. As previously explained, such air and gas voids may lead to various problems in the function and reliability of the components and circuit.

Referring now to FIGS. 2 and 3, there is shown the same component 100 and a mounting pad 110 having a plurality of vent holes 112 through the mounting pad 110 and circuit board 114.

According to the size and shape of the pad, the number of vent holes, their disposition about the pad, and their diameters may be varied. The vent holes may be drilled through mounting pad and the board during the same manufacturing stage where via holes are drilled, but unlike an electrically conductive via, the vent holes 112 may be left uncapped and are not plated closed to allow for the communication of air and gas through the board 114.

Vent holes 112 may be strategically disposed around the interior of pad 110 and are preferably spaced equally and/or symmetrically, to best communicate with the entire interior surface of the pad. In cases where the component and mating pad are small and only a single hole is provided on the pad, the hole may be disposed centrally on the pad. Component 100 may next be positioned and aligned on mounting pad 110 and component base 116 may be soldered to mounting pad 110 by the same method as described above or by any traditional method.

Referring to FIG. 3, it can be seen that during soldering, molten solder 120 flows into the interface or junction 122 between base surface 106 and pad 110. It should also be appreciated that vent holes 112 allow any air or gas 124 that may pre-exist or that may be created during soldering to escape there through and thereby through circuit board 114 and allow the molten solder 120 to completely fill junction 122. By substantially filling junction 122, the contact area between base surface 106 and pad 110 is maximized, thereby improving the structural bond and the thermal and electrical communication between the base surface and the pad.

In a second embodiment of a vented SMT pad, shown in FIG. 4, vents in the form of mask etched channels 212 along the surface of SMT pad 210 on circuit board 214 may be provided to allow the escape of gas from the junction between the component 100 and the pad. Such channels, arranged to provide communication between the interior of the surface of the pad and its periphery, allow off-gases and air to escape along the surface of the circuit board rather than through the board. According to the size and shape of the pad and the mating component base, such channels may be a single channel running from the center of the pad to its periphery or some network or pattern of channels such as the crossing channels 212 shown. The channels may be centrally or symmetrically disposed on the pad and allowing communication from the inner reaches of the solder junction to the perimeter of the pad and component, and thereby to the outside atmosphere.

It should be understood that the above disclosures are merely representative and that there are many possible embodiments for venting SMT pads, and that the scope of this disclosure should only be limited according to the following claims made thereto.

What is claimed is:

1. A surface mount electric circuit board for mounting an electronic component comprising a plurality of connection leads and a housing having a planar metallic bottom surface, comprising;

a base layer having a top surface;

a network of metallic conductor paths formed on said top surface of said base layer, said connection leads contacting said conductor paths and said conductor paths arranged for conducting electronic signals to or from said connection leads in contact therewith;

a mounting pad formed on said top surface of said base layer between said top surface of said base layer and a bottom surface of said component housing, said mounting pad having a planar metallic top surface disposed substantially coplanar with said planar metallic bottom surface of said component housing to form an interface plane;

an electrically conductive liquid to solid material disposed in said interface plane configured to solidify therein and to affix said component housing to said mounting pad;

wherein said mounting pad comprises a vent communicating between said upper surface of said mounting pad and the outside atmosphere to facilitate the escape of gas from said interface plane as said electrically conductive material is applied thereto;

wherein said metallic bottom surface of said component housing and said metallic top surface of said mounting pad are solder compatible and said electrically conductive liquid to solid material is a solder, and said solder is applied in a heated liquid state and solidifies by cooling, and wherein said vent comprises a hole drilled through said mounting pad and said circuit board to connect said interface plane to the outside atmosphere.

2. The circuit board of claim 1 wherein said hole is centrally disposed in said pad and passes normally through said circuit board.

3. The circuit board of claim 1 wherein said mounting pad comprises an interior portion and a periphery and said vent comprises one or more holes drilled through said mounting pad and said circuit board at said interior portion to connect said interior portion to the outside atmosphere.

4. The circuit board of claim 3 wherein said one or more holes is a plurality of holes symmetrically disposed about said interior portion of said pad.

5. The circuit board of claim 4 wherein one of said holes is centrally disposed in said pad.

6. The circuit board of claim 1 wherein said mounting pad comprises an interior portion and a periphery and said vent comprises an opening passing from said interior portion through said periphery, parallel to and in communication with said interface plane, to connect said interior portion to the outside atmosphere.

7. The circuit board of claim 6 wherein said opening comprises a solder free channel formed in said mounting pad.

8. The circuit board of claim 7 wherein said channel passes centrally through said pad.

9. The circuit board of claim 1 wherein said mounting pad comprises an interior portion and a periphery and said vent comprises a network of openings passing from said interior portion through said periphery, parallel to and in communication with said interface plane, to connect said interior portion to the outside atmosphere.

10. The circuit board of claim 9 wherein said network comprises a network of solder free channels formed in said mounting pad.

11. The circuit board of claim 10 wherein said network is symmetrically disposed on said planar top surface of said pad.

12. The circuit board of claim 11 wherein one of said channels is centrally disposed on said planar top surface of said pad.

13. The circuit board of claim 10 wherein said network comprises a plurality of channels connected at said interior portion and extending therefrom through said periphery.

* * * * *